(12) United States Patent
Hyun et al.

(10) Patent No.: US 12,145,333 B2
(45) Date of Patent: Nov. 19, 2024

(54) INKJET PRINTING APPARATUS AND DISPLAY PANEL MANUFACTURING METHOD USING THE SAME

(71) Applicant: Samsung Display Co., Ltd., Yongin-si (KR)

(72) Inventors: Jinho Hyun, Gwacheon-si (KR); Heechang Yoon, Anyang-si (KR); Hyoung Sub Lee, Yongin-si (KR); Hyemin Lee, Gimpo-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/890,656

(22) Filed: Aug. 18, 2022

(65) Prior Publication Data
US 2023/0094912 A1 Mar. 30, 2023

(30) Foreign Application Priority Data

Sep. 27, 2021 (KR) .................. 10-2021-0127332

(51) Int. Cl.
*B29D 11/00* (2006.01)
*B41J 2/045* (2006.01)
*G02B 5/20* (2006.01)

(52) U.S. Cl.
CPC .. *B29D 11/00634* (2013.01); *B29D 11/00865* (2013.01); *B29D 11/00951* (2013.01); *B41J 2/04505* (2013.01); *B41J 2202/09* (2013.01); *G02B 5/206* (2013.01); *G02B 2207/101* (2013.01)

(58) Field of Classification Search
None
See application file for complete search history.

(56) References Cited

U.S. PATENT DOCUMENTS

| | | | | |
|---|---|---|---|---|
| 3,798,807 | A * | 3/1974 | Stewart | G03B 35/24 40/471 |
| 6,310,637 | B1 * | 10/2001 | Shimada | B41J 19/145 15/40 |
| 2004/0247797 | A1 * | 12/2004 | Hirai | H01J 9/02 427/534 |
| 2007/0153050 | A1 * | 7/2007 | Chung | H05K 3/125 347/29 |

(Continued)

FOREIGN PATENT DOCUMENTS

JP H05149769 A 6/1993
JP 2006023275 A 1/2006

(Continued)

*Primary Examiner* — Charles Capozzi
(74) *Attorney, Agent, or Firm* — CANTOR COLBURN LLP

(57) ABSTRACT

An inkjet printing apparatus includes: a stage, which reciprocates in forward and reverse directions opposite to each other and has a target substrate disposed thereon; an inspection device including a film disposed outside the stage and a measurement unit which measures an inspection pattern provided on the film; and a head assembly, which moves along one direction crossing the forward direction and has a plurality of heads which supplies a liquid composition to the target substrate. The head assembly moves in the one direction to overlap the film and sprays the composition onto the film to form an inspection pattern.

14 Claims, 11 Drawing Sheets

(56) References Cited

U.S. PATENT DOCUMENTS

2016/0030970 A1* 2/2016 Okamura .............. B05C 5/0216
118/713

FOREIGN PATENT DOCUMENTS

| KR | 100561412 B1 | 3/2006 |
| KR | 101096489 B1 | 12/2011 |
| KR | 101164480 B1 | 7/2012 |
| KR | 1020160083420 A | 7/2016 |

* cited by examiner

INKJET PRINTING APPARATUS AND DISPLAY PANEL MANUFACTURING METHOD USING THE SAME

This application claims priority to Korean Patent Application No. 10-2021-0127332, filed on Sep. 27, 2021, and all the benefits accruing therefrom under 35 U.S.C. § 119, the content of which in its entirety is herein incorporated by reference.

BACKGROUND

The present disclosure herein relates to an inkjet printing apparatus including an inspection device, and a display panel manufacturing method using the inkjet printing apparatus.

An inkjet printing apparatus may be used to form an optical pattern, a color filter or a light-emitting layer of a display panel. For example, the inkjet printing device may form a component constituting a display panel by ejecting, onto a target substrate, an ink containing a base material and particles dispersed in the base material.

SUMMARY

The present disclosure provides an inkjet printing apparatus including an inspection device capable of easily measuring an aligned state of a composition sprayed onto a target substrate during bidirectional inkjet printing, and a display panel manufacturing method using the inkjet printing apparatus.

An embodiment of the invention provides an inkjet printing apparatus including: a stage which reciprocates in forward and reverse directions opposite to each other and has a target substrate disposed thereon; an inspection device including a film disposed outside the stage and a measurement unit which measures an inspection pattern provided on the film; and a head assembly which moves along one direction crossing the forward direction and has a plurality of heads which supplies a liquid composition to the target substrate. The head assembly moves in the one direction to overlap the film and sprays the composition onto the film to form an inspection pattern.

In an embodiment, the inspection device may include: a roller part having a first roller part and a second roller part that are spaced apart from each other and which reciprocates the film along the forward and reverse directions; and a film supply part and a film collection part spaced apart from each other and which roll according to a movement direction of the film when the film reciprocates.

In an embodiment, the inspection pattern may include a first inspection pattern and a second inspection pattern, each having a line shape extending in the one direction. After the head assembly forms the first inspection pattern on the film, the roller part may reciprocate the film by a predetermined distance and the head assembly may form the second inspection pattern on the film.

In an embodiment, each of the first inspection pattern and the second inspection pattern may contain a plurality of points, and the measurement unit may measure a distance in the forward direction between a center of a first point, among the points contained in the first inspection pattern, farthest away from the second inspection pattern in the forward direction, and a center of a second point, among the points contained in the second inspection pattern, farthest away from the first inspection pattern in the forward direction.

In an embodiment, when the distance between the first point and the second point is about 50 micrometers (μm) or less, the head assembly may move in the one direction to overlap the target substrate and spray the composition onto the target substrate.

In an embodiment, when the distance between the first point and the second point is greater than about 50 μm, a set value of the head assembly may be re-adjusted.

In an embodiment, the target substrate may include a plurality of regions, which are supplied with the composition. The regions may each extend in the forward direction, and the regions may be spaced apart from each other in the one direction.

In an embodiment, on each of the regions, a first spray of the composition may be performed when the stage moves in the forward direction, and a second spray of the composition may be performed when the stage moves in the reverse direction.

In an embodiment, the film may include a polymer.

In an embodiment, the film may include a water-repellent coating layer.

In an embodiment, the measurement unit may be disposed on one side of the inspection device or coupled to one side of the head assembly such that the measurement unit is aligned with the film.

In an embodiment, the inkjet printing apparatus may further include a transport device, which moves the stage in the forward direction or the reverse direction.

In an embodiment, the inkjet printing apparatus may further include a rail frame which extends in the one direction and guides the head assembly in the one direction, and vertical frames which support one end and the other end of the rail frame opposite to each other.

In an embodiment, the composition may include at least one of an organic material and a quantum dot.

In an embodiment of the invention, a display panel manufacturing method using an inkjet printing apparatus including a stage, a head assembly, and an inspection device having a film and a measurement unit, includes: performing a bidirectional printing; and inspecting a state of the head assembly. The performing of the bidirectional printing includes: aligning the head assembly over a target substrate disposed on the stage; spaying, onto the target substrate, a liquid composition contained in the head assembly; moving the stage in a forward direction so that a first spray of the composition is performed on a first region of the target substrate; and moving the stage in a reverse direction opposite to the forward direction so that a second spray of the composition is performed on the first region. The inspecting of the state of the head assembly includes: aligning the head assembly over the film; forming an inspection pattern by spraying the composition onto the film; and checking the inspection pattern.

In an embodiment, the forming of the inspection pattern may include: forming, by the head assembly, a first inspection pattern on the film; then reciprocating the film to correspond to reciprocation of the target substrate; and then forming, by the head assembly, a second inspection pattern on the film.

In an embodiment, the checking of the inspection pattern may include measuring a distance between the first inspection pattern and the second inspection pattern.

In an embodiment, when the distance is about 50 μm or less, the performing of the bidirectional printing may be re-performed.

In an embodiment, when the distance is greater than about 50 μm, a set value of the head assembly may be re-adjusted.

In an embodiment, each of the first inspection pattern and the second inspection pattern may contain a plurality of points and have a line shape extending along one direction crossing the forward direction.

BRIEF DESCRIPTION OF THE FIGURES

The accompanying drawings are included to provide a further understanding of the invention, and are incorporated in and constitute a part of this specification. The drawings illustrate embodiments of the invention and, together with the description, serve to explain principles of the invention. In the drawings.

DETAILED DESCRIPTION

Figure 1:
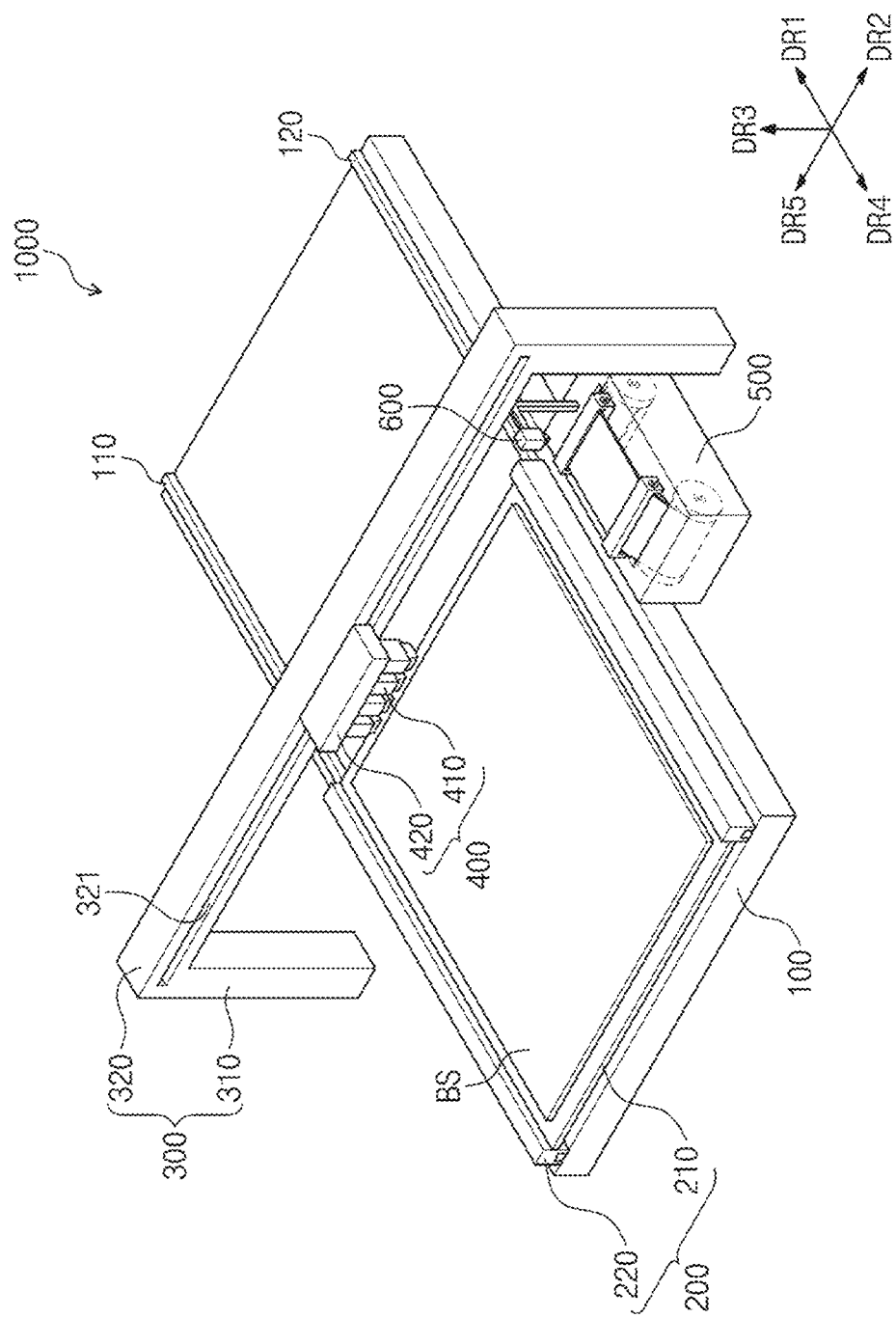
FIG. 1 is a perspective view of an inkjet printing apparatus according to an embodiment of the invention.

It will be understood that when an element (or region, layer, section, etc.) is referred to as being "on", "connected to" or "coupled to" another element, it can be disposed directly on, connected or coupled to the other element or a third intervening element may be disposed between the elements.

Like reference numbers or symbols refer to like elements throughout. In addition, in the drawings, the thickness, the ratio, and the dimension of elements are exaggerated for effective description of the technical contents. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." The term "and/or" includes one or more combinations which may be defined by relevant elements.

It will be understood that, although the terms first, second, etc. may be used herein to describe various elements, these elements should not be limited by these terms. These terms are only used to distinguish one element from another element. For example, a first element could be termed a second element without departing from the teachings of the present invention, and similarly, a second element could be termed a first element. As used herein, the singular forms are intended to include the plural forms as well, unless the context clearly indicates otherwise.

In addition, the terms, such as "below", "beneath", "on" and "above", are used for explaining the relation of elements shown in the drawings. The terms are relative concept and are explained based on the direction shown in the drawing.

It will be further understood that the terms such as "includes" or "has", when used herein, specify the presence of stated features, numerals, steps, operations, elements, parts, or the combination thereof, but do not preclude the presence or addition of one or more other features, numerals, steps, operations, elements, parts, or the combination thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value. Hereinafter, embodiments of the invention will be described with reference to the accompanying drawings.

Figure 2A:
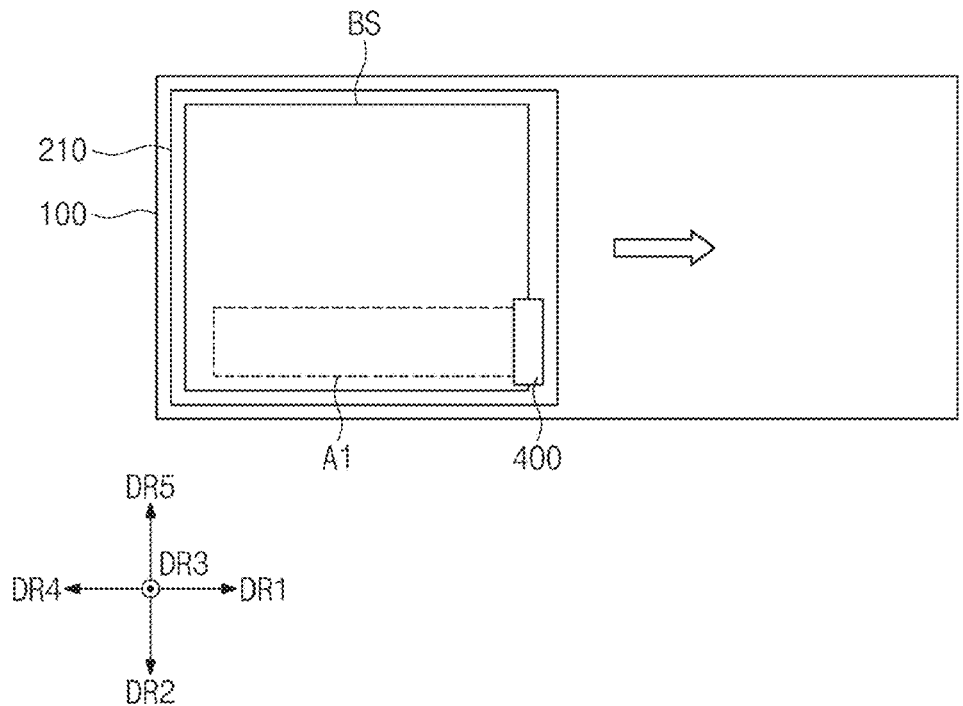
FIG. 2A is a plan view illustrating a relationship between a head assembly and a target substrate disposed on a stage according to an embodiment of the invention.
Figure 2B:
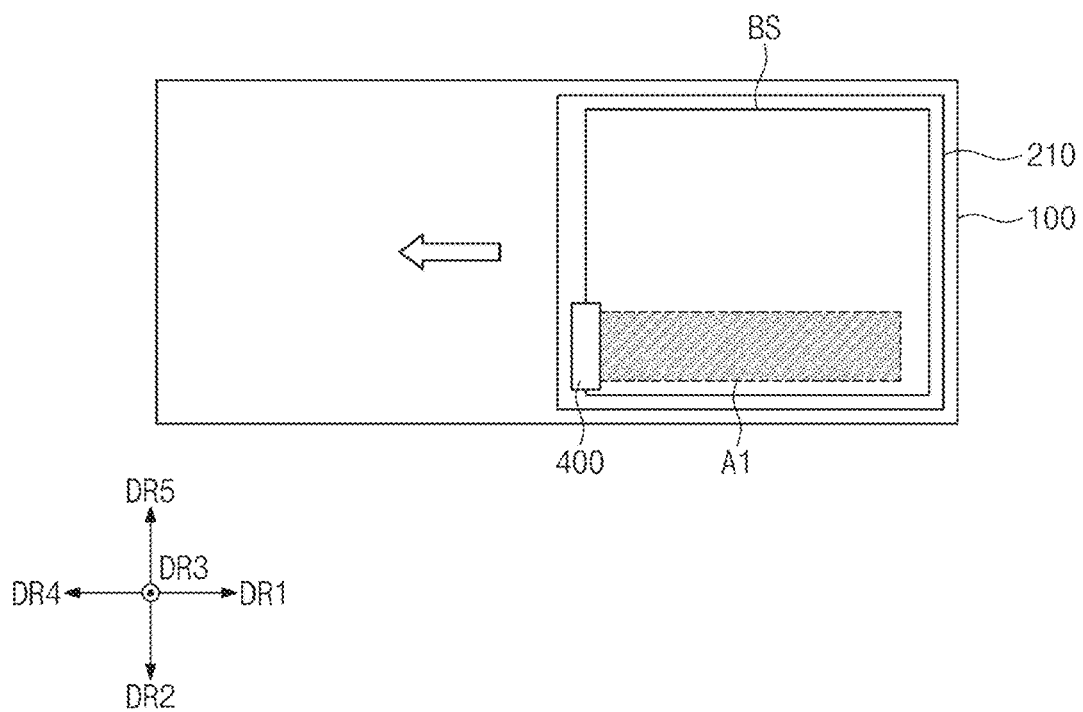
FIG. 2B is a plan view illustrating a relationship between a head assembly and a target substrate disposed on a stage according to an embodiment of the invention.
Figure 2C:
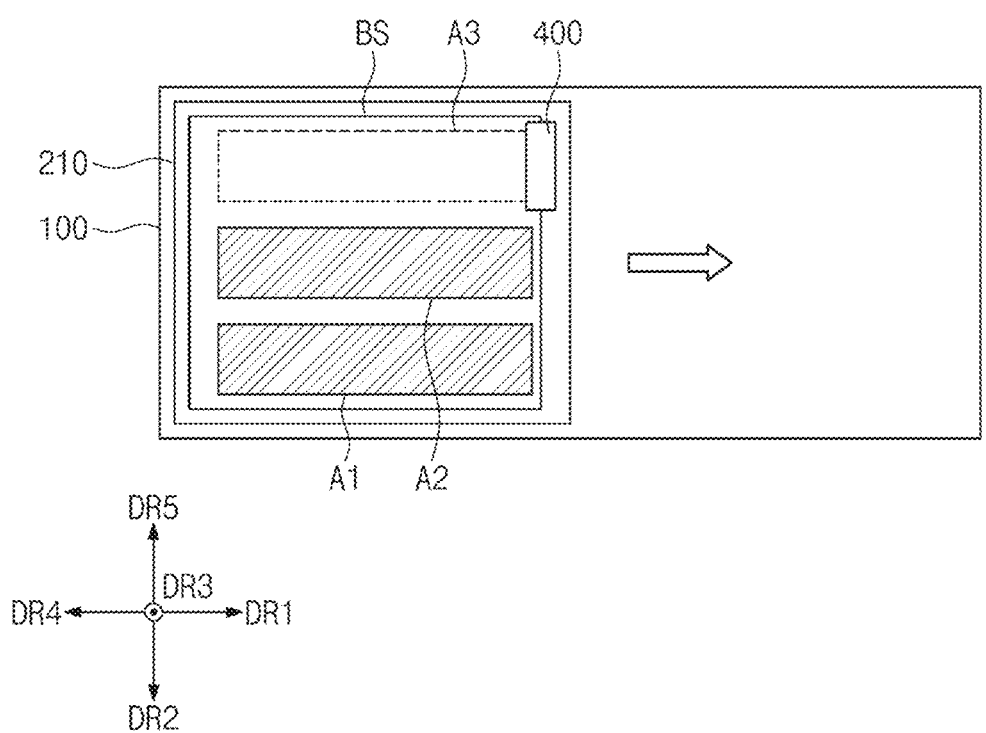
FIG. 2C is a plan view illustrating a relationship between a head assembly and a target substrate disposed on a stage according to an embodiment of the invention.

FIG. 1 is a perspective view of an inkjet printing apparatus according to an embodiment of the invention. FIG. 2A is a plan view illustrating a relationship between a head assembly and a target substrate disposed on a stage according to an embodiment of the invention. FIG. 2B is a plan view illustrating a relationship between a head assembly and a target substrate disposed on a stage according to an embodiment of the invention. FIG. 2C is a plan view illustrating a relationship between a head assembly and a target substrate disposed on a stage according to an embodiment of the invention.

Referring to FIG. 1, an inkjet printing apparatus 1000 according to an embodiment of the invention may include a support part 100, a transport part 200, a frame 300, a head assembly 400, an inspection device 500 and a measurement unit 600 included in the inspection device 500.

The support part 100 may provide a space in which the transport part 200 may be disposed. The support part 100 may include a plurality of rails 110 and 120. The rails 110 and 120 may each extend in a first direction DR1 and may be spaced apart from each other along a second direction DR2.

The transport part 200 may include a transport device 220 and a stage 210. The transport device 220 may be disposed on the rails 110 and 120 and coupled to the stage 210 to reciprocate the stage 210 in the first direction DR1 (in other words, "a forward direction") and in a fourth direction DR4

(in other words, "a reverse direction"). Thus, the transport device 220 may be reciprocated along the rails 110 and 120 by having a separate motor provided therein or through a separate control device connected through the support part 100.

The stage 210 may provide a flat surface on which a target substrate BS may be disposed. The stage 210 may be coupled to the transport device 220 and move from one end (i.e., forward end in the first direction DR1) to the other end (i.e., a rear end in the fourth direction DR4) of the support part 100.

Although not illustrated, the transport part 200 may include a vertical transport device capable of adjusting a distance in a third direction DR3 between the target substrate BS and the head assembly 400, and is not limited to any one embodiment.

The frame 300 may be disposed in the middle (between the forward end and the rear end) of the support part 100. The frame 300 may include vertical frames 310 and a rail frame 320.

The vertical frames 310 may each extend in the third direction DR3 and may be disposed apart from longer sides of the support part 100 in the second direction DR2 or in a fifth direction DR5, respectively.

The rail frame 320 may be disposed between upper ends of the vertical frames 310. The rail frame 320 may be disposed over the stage 210 and spaced apart from the target substrate BS by a predetermined distance in the third direction DR3.

The rail frame 320 according to this embodiment may include a frame rail 321 on which the head assembly 400 is movable in the second direction DR2 or in the fifth direction DR5. Thus, the rail frame 320 may guide the head assembly 400 in the second direction DR2 or in the fifth direction DR5.

The head assembly 400 may include a plurality of heads 410 and a head transport part 420.

The heads 410 may each include a storage tank capable of storing a liquid composition, and nozzles capable of spraying the composition onto the target substrate BS.

Each of the heads 410 is not limited to any one embodiment as long as being a head used in an inkjet printing apparatus. In addition, a component included in the head 410 may be applied to an embodiment of the invention as long as being a typical component (e.g., a filter, a stirrer, a pump, etc.).

The respective nozzles may be independently controllable. For example, when some of the nozzles are turned off (or in a closed state), others may be turned on (or in an open state). An ON and OFF interval (or open and closed interval or emission and non-emission interval) of each of the nozzles may be controlled. In addition, when an ejection state is changed due to a change in a set value during an initial printing process, the nozzles may be independently controlled.

The head transport part 420 may have one or more heads 410 coupled thereto and move the heads 410 over the target substrate BS. For example, the head transport part 420 may be provided with a separate motor to move the heads 410 along the frame rail 321 in the second direction DR2 or in the fifth direction DR5.

However, an embodiment of the invention is not limited thereto. In another embodiment, the head assembly 400 may be moved along the frame rail 321 through a separate transport device provided in the rail frame 320, and is not limited to any one embodiment.

The inspection device 500 may be disposed on one side of the stage 210. The inspection device 500 may inspect an aligned state of a composition sprayed from the head assembly 400.

The head assembly 400 according to an embodiment of the invention may be moved along the frame rail 321 in the second direction DR2 to overlap the inspection device 500. Thus, a hitting state of the heads 410 being used in a printing process may be immediately checked through the inspection device 500, which will be described later.

The inspection device 500 according to an embodiment may include a measurement unit 600. The measurement unit 600 may be disposed on one side of the inspection device 500 and measure a state of the composition supplied to the inspection device 500 during the inspection of the hitting state of the heads 410. The measurement unit 600 may be disposed on one side of the inspection device 500, using a structure such as a robot arm.

The measurement unit 600 is not limited to any one embodiment as long as being a device capable of inspecting a state of a liquid composition. For example, the measurement unit 600 may be provided as a device including a camera module such as a vision camera, and provided as a microscope, and is not limited to any one embodiment.

FIG. 1 illustrates that the measurement unit 600 is disposed on one side of the inspection device 500. However, an embodiment of the invention is not limited thereto, and the measurement unit 600 may be attached to one side of the head assembly 400 and moved along the frame rail 321 together with the head assembly 400 in another embodiment.

FIGS. 2A to 2C are plan views schematically illustrating a printing process of the inkjet printing apparatus 1000 (see FIG. 1) according to an embodiment of the invention.

Referring to FIGS. 2A to 2C, the target substrate BS may include a plurality of printing regions A1, A2 and A3. The printing regions A1, A2 and A3 may each extend in the first direction DR1 and may be arranged apart from each other along the second direction DR2.

Each of the printing regions A1, A2 and A3 of the target substrate BS may be a region that is cut after the printing process. The cut printing regions A1, A2 and A3 may be provided as at least one individual display panel, which will be described later.

Referring to FIG. 2A, a first forward printing process may be performed on a first region A1 of the target substrate BS. Here, the head assembly 400 may be fixed at a certain location over one side of the first region A1. At this state, the head assembly 400 may not be fixed to the one side of the first region A1. In a state where the head assembly 400 is fixed, the composition may be sprayed onto the first region A1 and simultaneously, the target substrate BS disposed on the stage 210 may move in the first direction DR1. FIG. 2B illustrates, by using hatching, the first region A1 supplied with the composition after the first forward printing process.

Referring to FIG. 2B, after the first forward printing process, the inkjet printing apparatus according to an embodiment of the invention may perform a first reverse printing process. Here, the head assembly 400 may be fixed at the same position at which the head assembly 400 is fixed during the first forward printing process. A starting point of the first reverse printing process may be an ending point of the first forward printing process.

In a state where the head assembly 400 is fixed, the composition may be re-sprayed onto the first region A1 and simultaneously, the target substrate BS disposed on the stage 210 may move in the fourth direction DR4. Accordingly, two inkjet printing processes may be performed on the first region A1.

Thereafter, FIG. 2C illustrates a position of the head assembly 400 at which a third forward printing process on a third region A3 starts, after a second forward/reverse printing process is performed on a second region A2 in the same way as the first forward/reverse printing process. As the printing process progresses from the first region A1 to the third region A3, the head assembly 400 may be moved to a corresponding region along the fifth direction DR5.

FIGS. 2A to 2C exemplarily illustrate the first to third regions A1, A2 and A3, but the number of regions to be printed on the target substrate BS is not limited to any one embodiment.

The inkjet printing apparatus 1000 according to an embodiment of the invention may provide an apparatus capable of performing bidirectional inkjet printing on the same region. Accordingly, the cost and time for the printing process may be reduced, and the number of the heads 410 (see FIG. 1) included in the head assembly 400 may be reduced, compared to a unidirectional printing process. Therefore, the inkjet printing apparatus 1000 with improved process yield may be provided.

Figure 3:
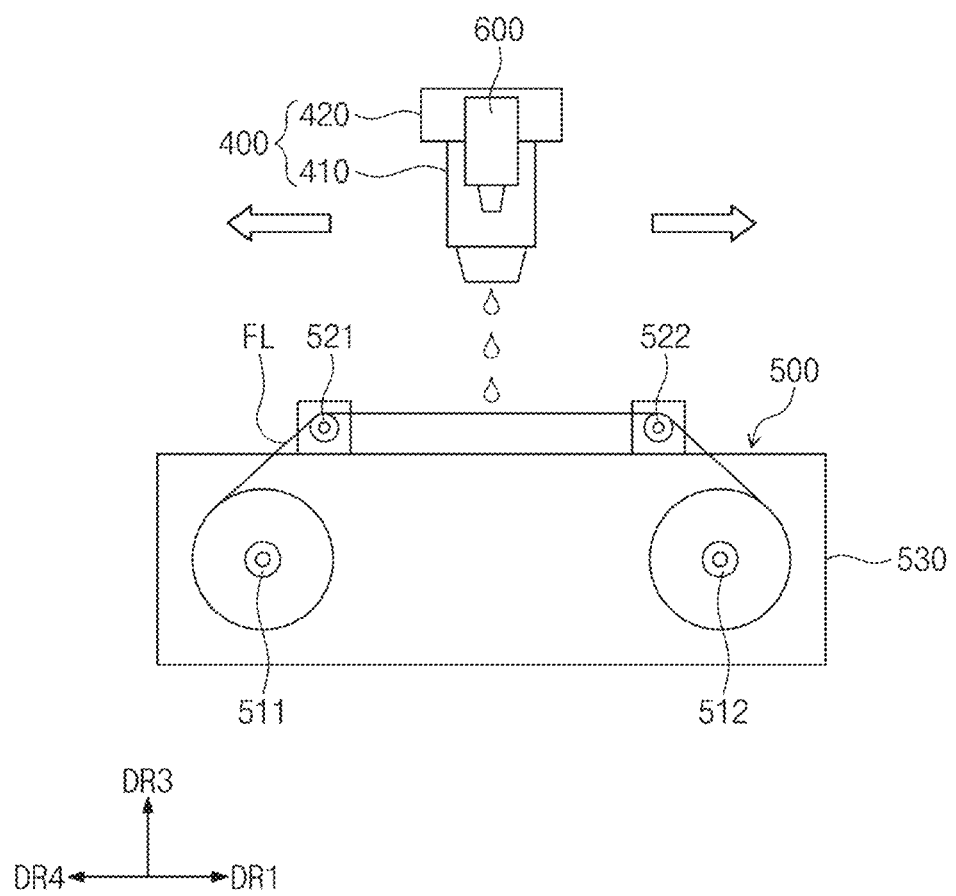
FIG. 3 is a cross-sectional view illustrating a relationship among an inspection device, a measurement unit and a head assembly according to an embodiment of the invention.
Figure 4:
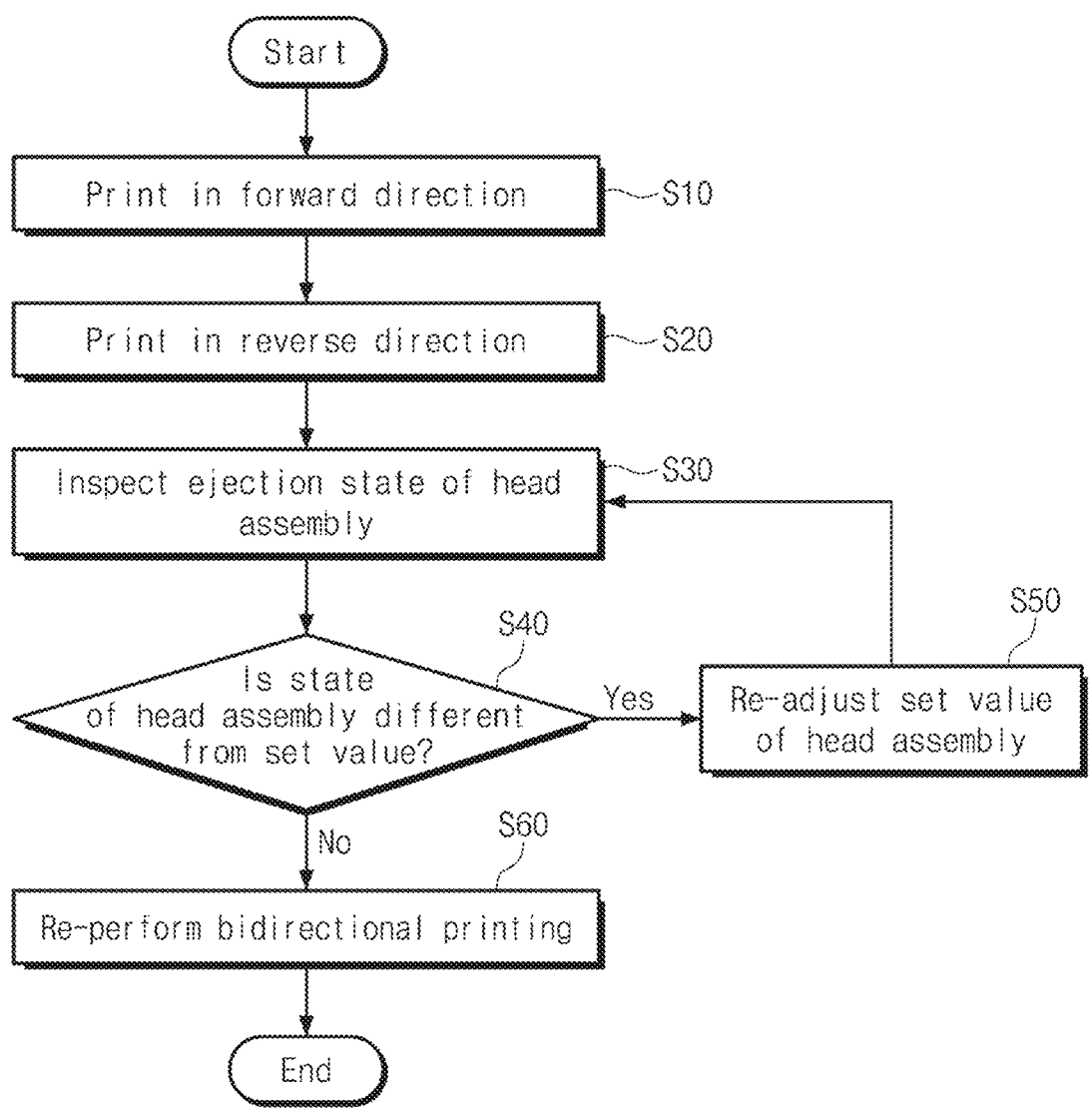
FIG. 4 is a block diagram illustrating an algorithm of an inkjet printing process according to an embodiment of the invention.
Figure 5:
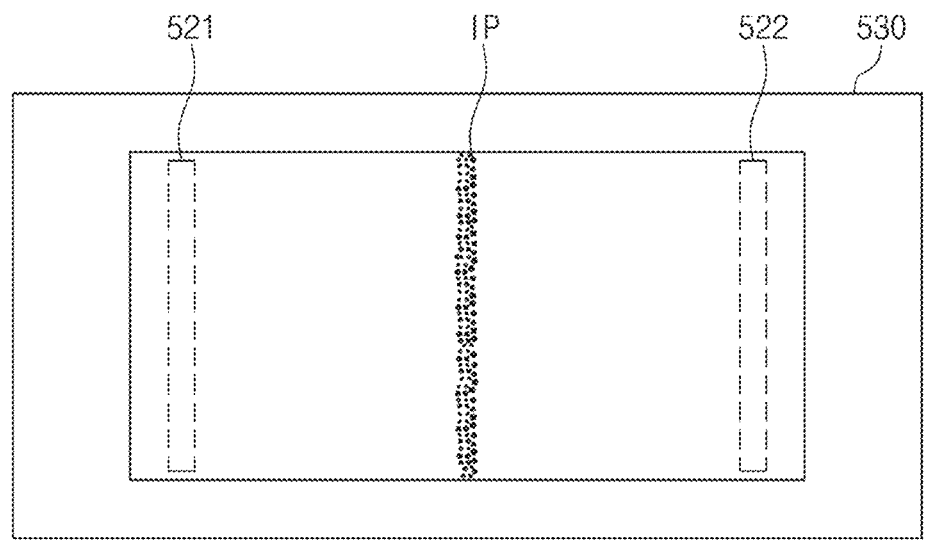
FIG. 5 is a plan view illustrating an inspection device and an inspection pattern formed thereon according to an embodiment of the invention.
Figure 5:
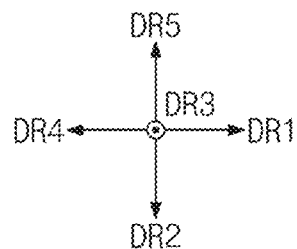
Figure 6:
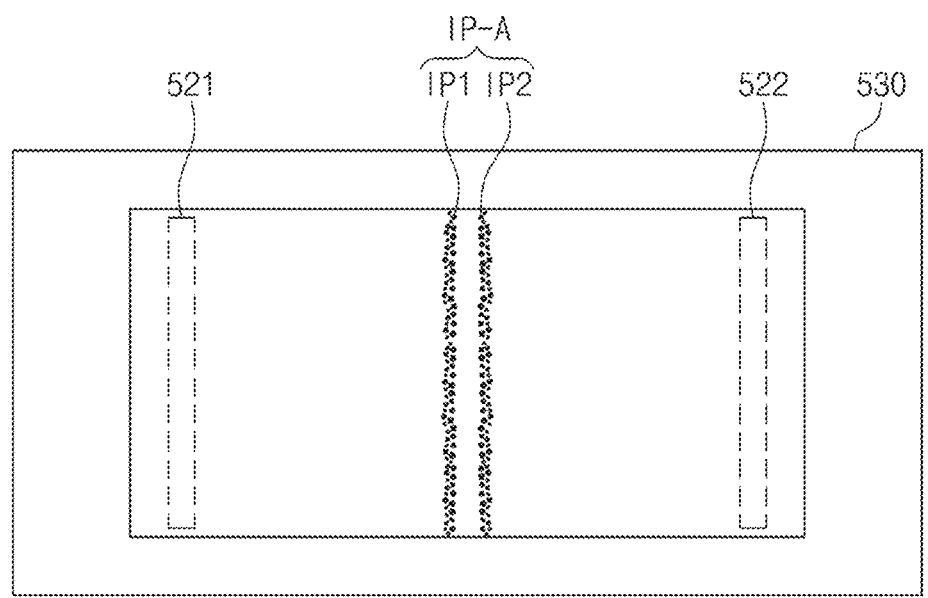
FIG. 6 is a plan view illustrating an inspection device and an inspection pattern formed thereon according to an embodiment of the invention.
Figure 6:
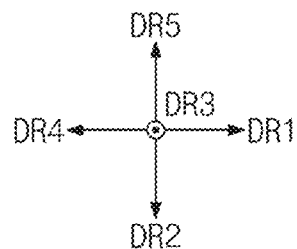
Figure 7:
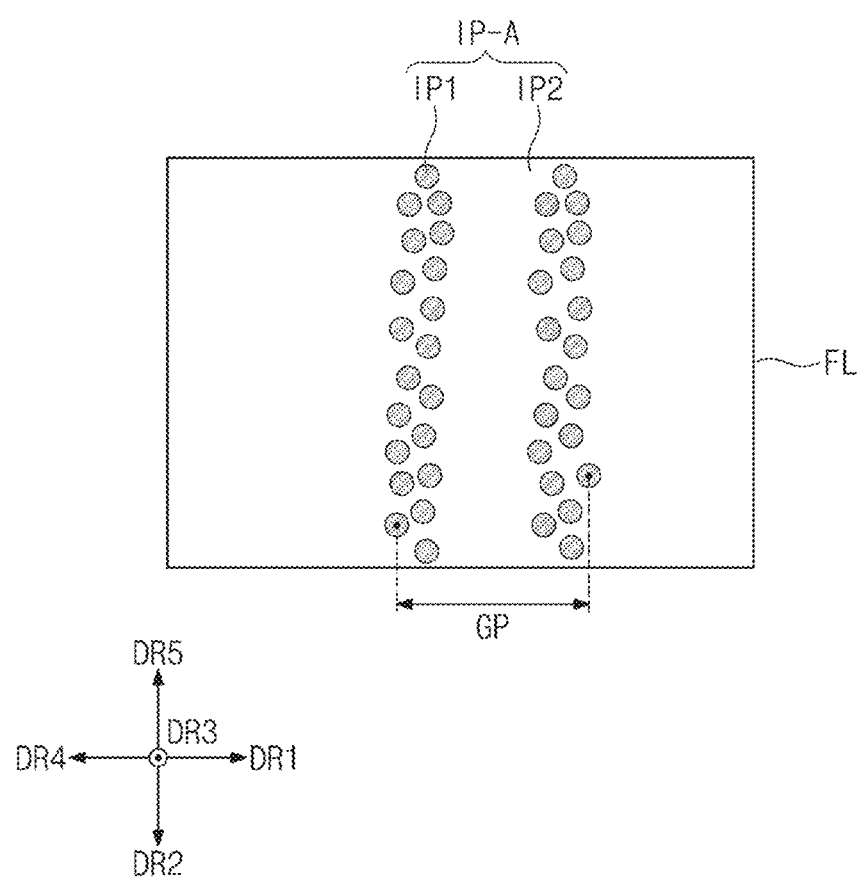
FIG. 7 is a plan view of an inspection pattern according to an embodiment of the invention.

FIG. 3 is a cross-sectional view illustrating a relationship among an inspection device, a measurement unit and a head assembly according to an embodiment of the invention. FIG. 4 is a block diagram illustrating an algorithm of an inkjet printing process according to an embodiment of the invention. FIG. 5 is a plan view illustrating an inspection device and an inspection pattern formed thereon according to an embodiment of the invention. FIG. 6 is a plan view of an inspection pattern according to an embodiment of the invention. FIG. 7 is a plan view of an inspection pattern according to an embodiment of the invention.

Referring to FIG. 3, an inspection device 500 according to an embodiment of the invention may be a device that inspects the hit state of the composition supplied by the heads 410 during the printing process described with reference to FIGS. 2A to 2C.

Since the inkjet printing apparatus 1000 (see FIG. 1) according to an embodiment of the invention performs a bidirectional printing process on the same region, the bidirectional printing process with a uniform printed state may be achieved, in a case that the hit state of the composition sprayed from the head assembly 400 at the time of starting (or ending) an n-th forward printing process, and the hit state of the composition sprayed from the head assembly 400 at the time of ending (or starting) an n-th reverse printing process are aligned.

According to an embodiment of the invention, the head assembly 400 used during the bidirectional printing process may be moved to the inspection device 500 and thus, the inspection device 500 may inspect the hit state of the composition that is sprayed from the head assembly 400 under the same conditions. Components of the inspection device 500 will be described below.

The inspection device 500 may include a film FL, a film supply part 511, a film collection part 512, a roller part and a housing 530. The roller part may include a first roller part 521 and a second roller part 522.

The housing 530 may have the film supply part 511 and film collection part 512 disposed therein and define opening portions allowing entry and exit of the film FL. The housing 530 may be omitted in the inspection device 500 in another embodiment and is not limited to any one embodiment.

The film FL may provide a surface similar to a surface of the target substrate BS. For example, the film FL may include a polymer material. For example, the film FL may include a polymer.

The film FL according to an embodiment may further include a water-repellent coating layer that is disposed on a surface supplied with the composition. The water-repellent coating layer is not limited to any one embodiment as long as being a typical layer including a water-repellent material.

The film supply part 511 and the film collection part 512 may be spaced apart from each other and aligned apart from each other along the first direction DR1. The film supply part 511 and the film collection part 512 may be rolled to move the direction of the film FL.

The film supply part 511 may supply a new film FL when an inspection is being performed in the inspection device 500, and the film collection part 512 may collect the film FL used in the inspection. Accordingly, the used film FL may be rolled in the film collection part 512, and a new film FL may be supplied by the film supply part 511 when a new inspection starts.

The roller part may be a transport device that rolls the film FL so that the film FL is moved in the first direction DR1 or in the fourth direction DR4. The roller part may include the first roller part 521 and the second roller part 522. The first roller part 521 and the second roller part 522 may be disposed on the housing 530. The first roller part 521 and the second roller part 522 may be driven by an individual motor or may be connected to a support part 100 to be driven by a control device, and is not limited to any one embodiment.

The film FL may be moved through the first roller part 521 and the second roller part 522 in the first direction DR1 or in the fourth direction DR4 to correspond to the reciprocation of the target substrate BS on the stage 210 in the first direction DR1 or in the fourth direction DR4, when the bidirectional printing process is performed on the same region of the target substrate BS.

That is, when the film FL is moved in the first direction DR1, the first roller part 521 and the second roller part 522 may be rotated in a clockwise direction, and the film supply part 511 and the film collection part 512 may be rotated corresponding to the movement of the film FL.

When the film FL is moved in the fourth direction DR4, the first roller part 521 and the second roller part 522 may be rotated in a counterclockwise direction, and the film supply part 511 and the film collection part 512 may be rotated corresponding to the movement of the film FL.

The speed, at which the stage 210 (see FIG. 1) moves the target substrate BS in the first direction DR1 or in the fourth direction DR4, may be set to be equal to the speed at which the first roller part 521 and the second roller part 522 move the film FL in the first direction DR1 or in the fourth direction DR4 by rolling the film FL.

According to an embodiment of the invention, the head assembly 400 may hit the composition onto the film FL of the inspection device 500 under the same conditions as those when hitting the composition onto the target substrate BS (see FIG. 1).

FIG. 3 exemplarily illustrates that the measurement unit 600 is disposed on one side of the head assembly 400. According to an embodiment of the invention, the hit state of the composition formed on the film FL of the inspection device 500 may be immediately checked through the measurement unit 600.

With reference to FIGS. 4 to 7, a display panel manufacturing method using an inkjet printing apparatus 1000 including an inspection device 500 according to an embodiment of the invention will be described.

FIG. 4 is a block diagram schematically illustrating an algorithm for inspecting a hitting state of a head assembly through an inspection device 500 when a display panel manufacturing method is performed through an inkjet printing apparatus 1000 according to an embodiment of the invention.

The display panel manufacturing method according to an embodiment of the invention includes: printing in a forward direction (S10), printing in a reverse direction (S20), and inspecting an ejection state of a head assembly (S30). The display panel manufacturing method according to an embodiment of the invention may further include: checking whether the state of the head assembly 400 is different from a set value of the head assembly (S40), re-adjusting the set value of the head assembly (S50), and re-performing the bidirectional printing (S60). The printing in the forward direction (S10) and the printing in the reverse direction (S20) together may be defined as "bidirectional printing".

The printing in the forward direction (S10) may include: aligning the head assembly 400 (see FIG. 1) over the target substrate BS (see FIG. 1) disposed on the stage 210 (see FIG. 1), spaying, onto the target substrate BS, a liquid composition contained in the head assembly 400, and moving the stage 210 in the forward direction so that first spray of the composition is performed on one region of the target substrate BS.

The printing in the reverse direction (S20) may include: moving the stage 210 in the reverse direction so that second spray of the composition is performed on the one region.

According to an embodiment of the invention, the one region may be subjected to the printing process twice in opposite directions. That is, one time is performed through the printing in the forward direction (S10), and the other time is performed through the printing in the reverse direction (S20).

The printing in the forward direction (S10) and the printing in the reverse direction (S20) may be performed as the same process as the bidirectional printing process described with reference to FIGS. 2A to 2C.

Thereafter, the inspecting of the state of the head assembly (S30) may be followed. The inspecting of the state of the head assembly 400 (S30) may include: aligning the head assembly 400 over the film FL, forming an inspection pattern IP and IP-A by spraying the composition onto the film FL, and checking the inspection pattern IP and IP-A.

The inspection pattern IP and IP-A may be formed by moving the head assembly 400 that sprayed the composition onto the target substrate BS, aligning the head assembly 400 over the film FL, and then spraying the composition onto the film FL.

The spray conditions of the head assembly 400 for formation of the inspection pattern IP and IP-A may be the same as the spray conditions of the head assembly 400 under which the bidirectional printing process was performed on the target substrate BS.

For example, the moving speed of the target substrate BS in the first direction DR1 or in the fourth direction DR4, may be the same as the moving speed of the film FL in the first direction DR1 or in the fourth direction DR4. The time when the reverse printing is started (ended) after the start (and end) of the forward printing performed on the target substrate BS may be the same as the time for the forming of the inspection pattern IP and IP-A performed on the film FL. In addition, the waveform of the composition sprayed from the head assembly 400 may be the same on both the target substrate BS and on the film FL.

The inspection pattern IP and IP-A according to an embodiment may have a line shape extending in the second direction DR2. That is, while the head assembly 400 continuously spays the composition onto the entirety of one region of the target substrate BS, the head assembly 400 may spray a small amount of the composition onto the film FL to form the line-shaped inspection pattern IP and IP-A.

The inspection pattern IP and IP-A may be formed by ejecting the composition onto the film FL at least twice. For example, the inspection pattern IP and IP-A may include a first inspection pattern and a second inspection pattern.

After the first inspection pattern is formed in the line shape on the film FL, the film FL is reciprocated along the first direction DR1 or the fourth direction DR4 to correspond to a movement distance of the target substrate BS in the bidirectional printing process.

Here, the second inspection pattern is formed in the line shape on the film FL in a time corresponding to the time at which the bidirectional printing process ends on the target substrate BS. Alternatively, after the first inspection pattern is formed on the film FL, the film FL may be moved in the first direction DR1 and the second inspection pattern may be formed on the film FL in a time corresponding to the time at which the printing in the reverse direction starts on the target substrate BS.

Thus, the first inspection pattern which is formed at the starting (or ending) point of the forward printing process in the bidirectional printing process on the target substrate BS, and the second inspection pattern which is formed at the ending (or starting) point of the reverse printing process are formed on the film FL.

A cycle in which the performing of the bidirectional printing (S10 and S20) through the inkjet printing apparatus 1000 is changed to the inspecting of the state of the head assembly (S30) may vary depending on the area of the target substrate BS and the state of the heads 410, and is not limited to any one embodiment.

Thereafter, the checking of the inspection pattern IP and IP-A (S40) may be performed by inspecting, through the measurement unit 600 (see FIG. 1), the hit state of the inspection pattern IP and IP-A formed on the film FL. That is, whether the state of the head assembly 400 is different from a set value of the head assembly 400 is checked.

According to the state of the inspection pattern IP and IP-A measured by the measurement unit 600, the next performance is determined. For example, the set value of the head assembly (S50) is re-adjusted when the hitting state of the head assembly 400 is different from an initial set value (hereinafter "poor state"), and the bidirectional printing (S60) is re-performed when the hitting state of the head assembly 400 is the same as the initial set value (hereinafter "normal state").

Hereinafter, examples of a normal state and a poor state of an inspection pattern IP and IP-A formed on a film FL will be described with reference to FIGS. 5 to 7.

FIG. 5 illustrates the inspection pattern IP formed on the film FL when the head assembly 400 (see FIG. 1) is in the normal state.

The inspection pattern IP may be formed as a single line by superimposing a first inspection pattern and a second inspection pattern which are formed by two ejections of the composition from the head assembly 400. The inspection pattern IP may include a plurality of points. That is, this may be a case that even though the first inspection pattern may be formed before the first forward printing process and the second inspection pattern that has the same shape with the first inspection pattern may be formed after the first forward printing process and the first reverse printing process at the same position, separately, these two inspection patterns are superimposed to make a single line. In addition, the first inspection pattern may be formed after n (n is a natural number) order forward printing process and reverse printing process in one region of the target substrate, and the second inspection pattern may be formed after n+1 order forward printing process and a reverse printing process in another region of the target substrate.

When the head assembly 400 forms the inspection pattern IP in the inspection device 500 (see FIG. 1), the composition ejected from the head assembly 400 during the bidirectional printing may be determined to be in the normal state where the starting (or ending) point of the forward printing process is the same as the ending (or starting) point of the reverse printing process.

Accordingly, the ejection state of the head assembly 400 may be determined to be in the normal state, and the bidirectional printing (S60) may be re-performed subsequently. The bidirectional printing (S60) may be re-performed as the same process as the bidirectional printing described above.

FIGS. 6 and 7 illustrate the inspection pattern IP-A formed on the film FL when the head assembly 400 (see FIG. 1) is in the poor state.

The inspection pattern IP-A may include a first inspection pattern IP1 and a second inspection pattern IP2 formed through two ejections of the composition from the head assembly 400. That is, the first inspection pattern IP1 may be formed before the first forward printing process, and the second inspection pattern IP2 may be formed after the first forward printing process and the first reverse printing process. In addition, the first inspection pattern IP1 may be formed after n (n is a natural number) order forward printing process and reverse printing process, and the second inspection pattern IP2 may be formed after n+1 order forward printing process and a reverse printing process. The first inspection pattern IP1 and the second inspection pattern IP2 may each extend in the second direction DR2 and may be spaced apart by a predetermined distance GP along the first direction DR1. The first inspection pattern IP1 and the second inspection pattern IP2 may each include a plurality of points.

When the head assembly 400 forms the inspection pattern IP-A in the inspection device 500 (see FIG. 1), the composition ejected from the head assembly 400 during the bidirectional printing may be determined to be in a state where the starting (or ending) point of the forward printing process is different from the ending (or starting) point of the reverse printing process.

Here, when the distance GP is about 50 micrometers (μm) or less, the ejection state of the head assembly 400 may be determined to be in the normal state and thus the bidirectional printing (S60) may be re-performed.

However, when the distance GP is greater than about 50 μm, the ejection state of the head assembly 400 may be determined to be in the poor state and thus the set value of the head assembly 400 (S50) may be re-adjusted.

The distance GP may be measured as a distance in the first direction DR1 between the center of a point, among the points contained in the first inspection pattern IP1, disposed farthest away from the second inspection pattern IP2 in the first direction DR1, and the center of a point, among the points contained in the second inspection pattern IP2, disposed farthest away from the first inspection pattern IP1 in the first direction DR1.

The factor by which the set value of the head assembly 400 is re-adjusted is not limited to any one embodiment as long as being a factor by which the hit shape of the composition is changed. For example, the set value is not limited to any one embodiment as long as the factor is a factor, by which the hit shape of the composition is changed, such as the moving speed of the head assembly 400, the waveform of the head assembly 400, the replacement or position of the nozzle included in the heads 410 (see FIG. 3), the moving speed of the target substrate BS (see FIG. 1), the concentration of the composition contained in the heads 410, etc.

After the re-adjusting of the set value of the head assembly (S50), the inspecting of the state of the head assembly (S30) and the checking of whether the gap is created (S40) may be performed again. Here, when the head assembly 400 is determined to be in the normal state, the bidirectional printing (S60) may be re-performed.

Since the inkjet printing apparatus 1000 according to an embodiment of the invention performs the bidirectional printing process, the cost and time for the printing process may be reduced and the number of the heads 410 included in the head assembly 400 may be effectively reduced, compared to a unidirectional printing process.

In addition, the hit state of the composition according to an initial set value of the head assembly 400 is immediately inspected through the inspection device 500 disposed on one side of the stage 210 (see FIG. 1), and the state of the head assembly 400 is determined, thereby providing an inkjet printing apparatus 1000 with improved process yield.

Figure 8:
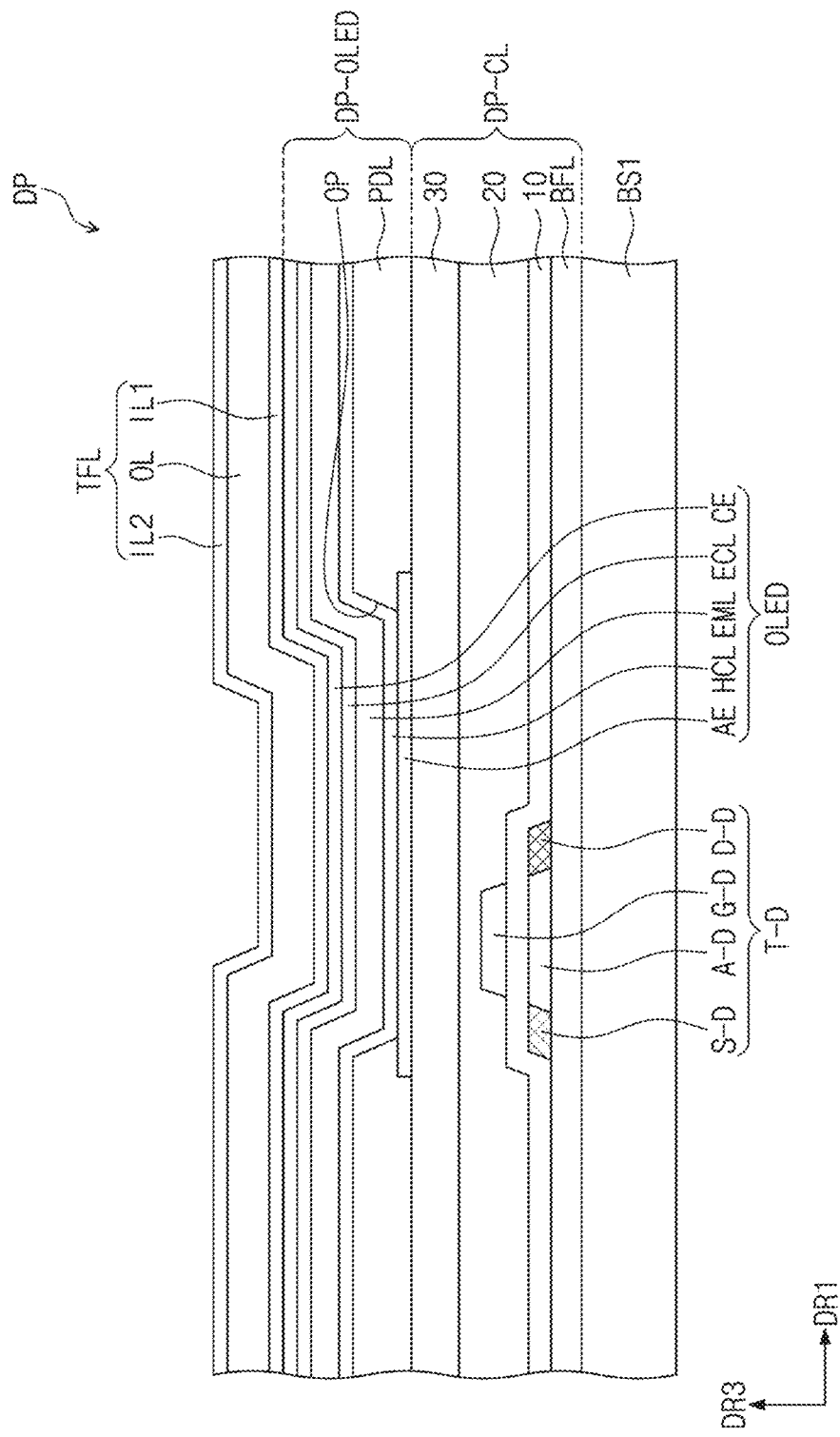
FIG. 8 is a cross-sectional view of a display panel according to an embodiment of the invention.
Figure 9:
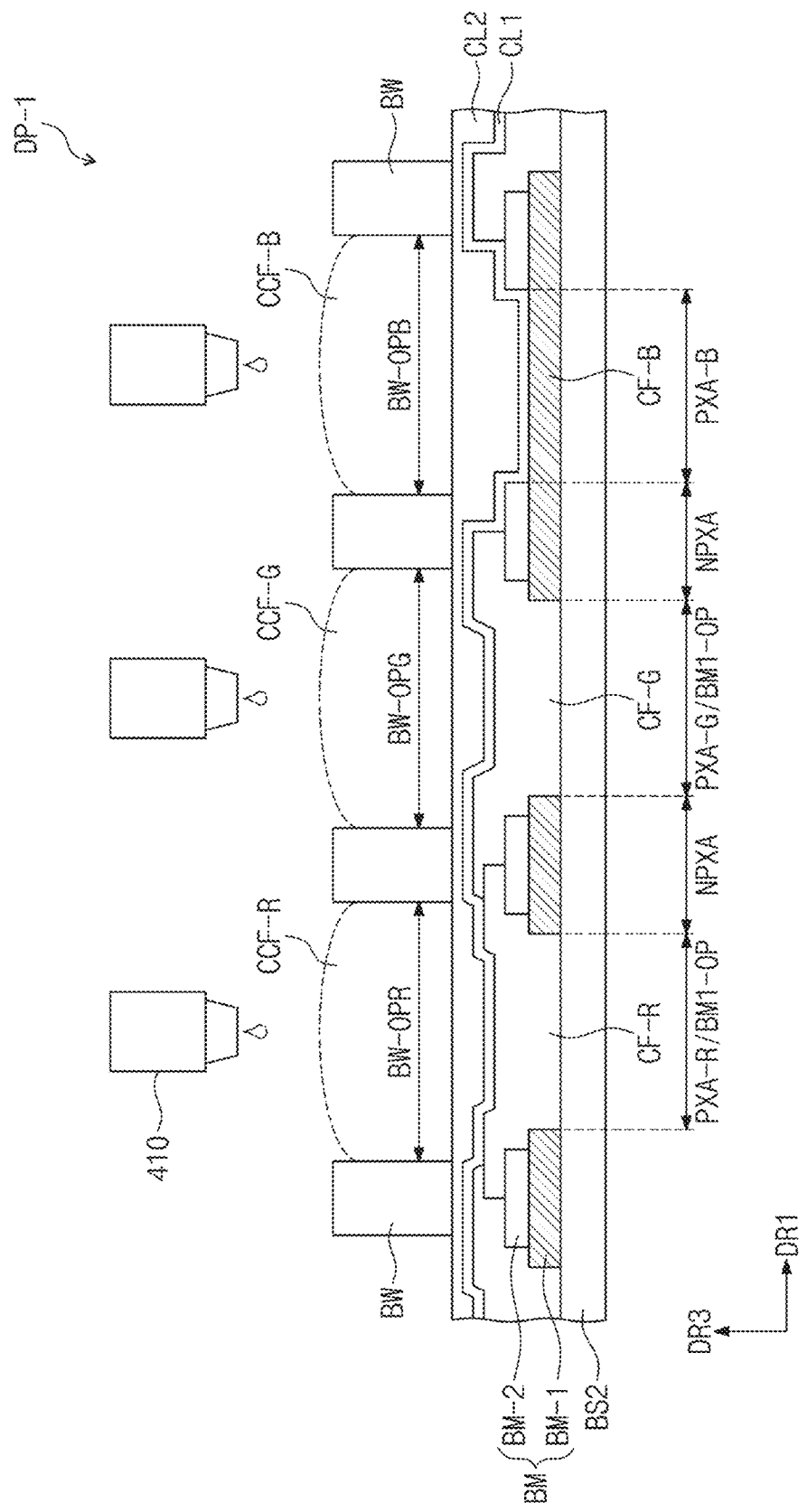
FIG. 9 is a cross-sectional view of a display panel according to another embodiment of the invention.
Figure 10:
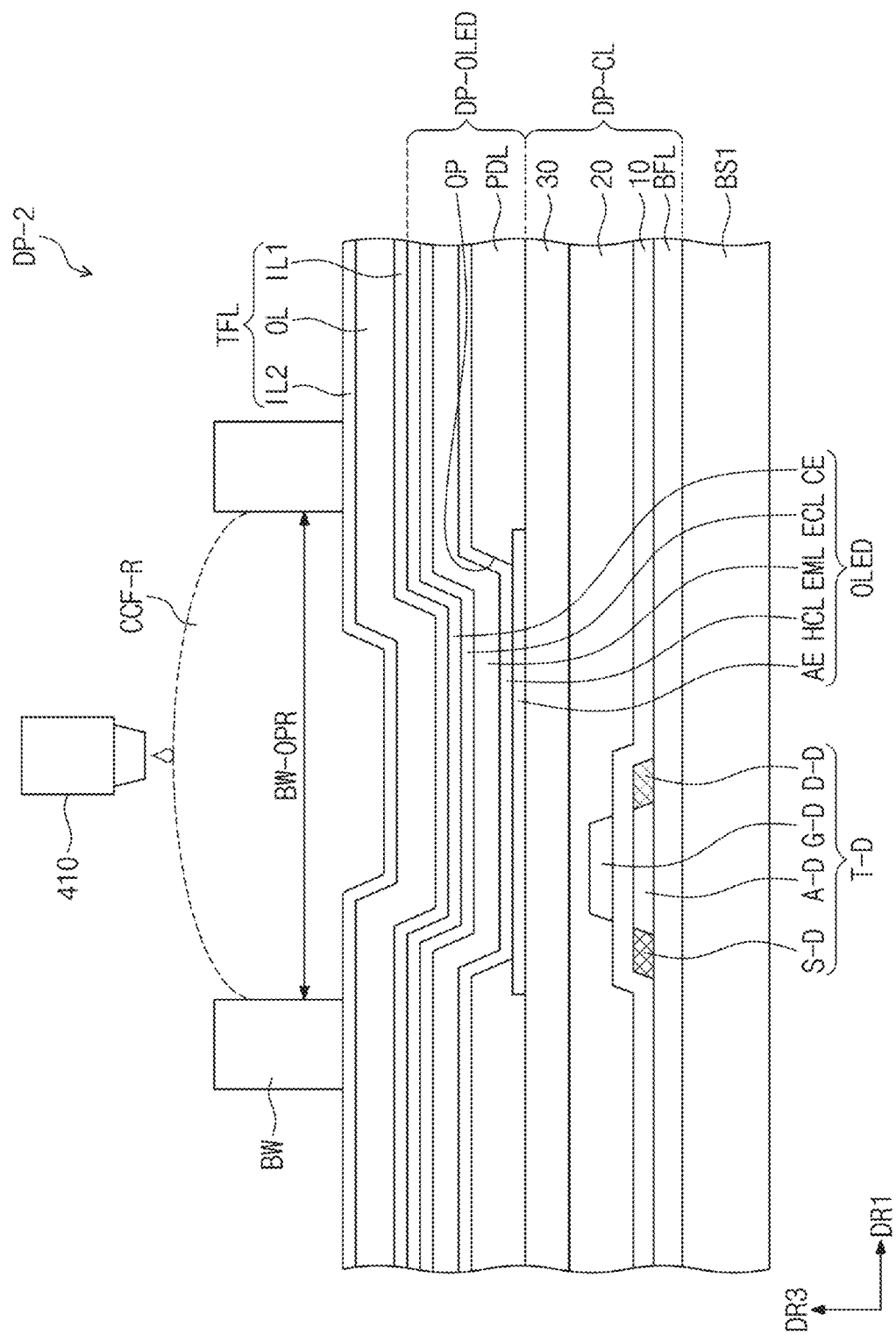
FIG. 10 is a cross-sectional view of a display panel according to still another embodiment of the invention.

FIG. 8 is a cross-sectional view of a display panel according to an embodiment of the invention. FIG. 9 is a cross-sectional view of a display panel according to another embodiment of the invention. FIG. 10 is a cross-sectional view of a display panel according to still another embodiment of the invention.

FIGS. 8 to 10 illustrate embodiments of a display panel including at least one layer formed through the inkjet printing apparatus 1000 (see FIG. 1) described with reference to FIGS. 1 to 7. Same/similar reference numbers or symbols refer to the same/similar elements as/to those described with reference to FIGS. 1 to 7, and duplicate description is omitted.

Referring to FIG. 8, a display panel DP according to an embodiment may include a circuit element layer DP-CL, a display element layer DP-OLED and an upper insulating layer TFL.

The display panel DP may include a plurality of insulating layers, a plurality of semiconductor patterns, a plurality of conductive patterns, and a plurality of signal lines. An insulating layer, a semiconductor layer and a conductive layer are formed through coating, deposition or the like.

Thereafter, the insulating layer, the semiconductor layer and the conductive layer may be selectively patterned by performing a photolithography process. In such a way, a plurality of semiconductor patterns, a plurality of conductive patterns and a plurality of signal lines included in the circuit element layer DP-CL and the display element layer DP-OLED may be formed.

A first base substrate BS1 may include a plastic substrate or a glass substrate. In this embodiment, the circuit element layer DP-CL may include a buffer film BFL, a first insulating layer 10, a second insulating layer 20 and a third insulating layer 30. For example, the buffer film BFL, the first insulating layer 10 and the second insulating layer 20 may each be an inorganic layer, and the third insulating layer 30 may be an organic layer. The first base substrate BS1 may correspond to the target substrate BS described above.

The display panel DP may include at least one transistor. FIG. 8 exemplarily illustrates one driving transistor T-D. The driving transistor T-D may include an active A-D, a source S-D, a drain D-D and a gate G-D. The active A-D, the source S-D and the drain D-D may be regions divided according to the doping concentration or conductivity of the semiconductor pattern.

The display element layer DP-OLED includes a light-emitting element OLED. The light-emitting element OLED may generate source light. The light-emitting element OLED includes a first electrode AE exposed by an opening portion OP defined in the pixel definition film PDL, a second electrode CE, and a light-emitting layer EML disposed therebetween. In this embodiment, the display element layer DP-OLED may include an organic light-emitting diode. The display element layer DP-OLED includes the pixel definition film PDL. For example, the pixel definition film PDL may be an organic layer.

The light-emitting element OLED may further include a hole control layer HCL disposed between the first electrode AE and the light-emitting layer EML, and an electron control layer ECL disposed between the light-emitting layer EML and the second electrode CE.

The upper insulating layer TFL may be disposed on the light-emitting element OLED to protect the light-emitting element OLED. The upper insulating layer TFL may include a plurality of inorganic layers IL1 and IL2, and an organic layer OL disposed between the inorganic layers IL1 and IL2. The display panel DP may include a plurality of light-emitting elements, and the organic layer OL may be formed to cover the entirety of the light-emitting elements. The inkjet printing apparatus 1000 according to an embodiment of the invention may be used to form the organic layer OL included in the upper insulating layer TFL. Thus, the composition contained in each of the heads 410 (see FIG. 1) described above may include an organic material.

Referring to FIG. 9, a display panel DP-1 according to an embodiment includes a second base substrate BS2, split patterns BM disposed on the second base layer BS2, color filters CF-R, CF-G and CF-B, light conversion patterns CCF-R, CCF-G and CCF-B disposed on the color filters CF-R, CF-G and CF-B, respectively, and partition walls BW.

The second base substrate BS2 may include a plastic substrate or a glass substrate. The second base substrate BS2 may correspond to the target substrate BS described above.

The split patterns BM may each have a multilayer structure. A first layer BM-1 may include the same material as that of a color filter that transmits blue light. A second layer BM-2 may include a typical black coloring agent. The second layer BM-2 may include a black dye or black pigment mixed in a base resin.

In the first layer BM-1 of the split pattern BM, opening portions BM1-OP may be defined which correspond to first and second pixel regions PXA-R and PXA-G, respectively. The first layer BM-1 overlapping a third pixel region PXA-B in a plan view may be formed in a single pattern with no opening portion.

The light conversion patterns CCF-R, CCF-G and CCF-B may modify optical properties of the source light. In this embodiment, the light conversion patterns CCF-R, CCF-G and CCF-B may absorb the source light and then generate light having different colors. In this embodiment, a first light conversion pattern CCF-R disposed in the first pixel region PXA-R may absorb the source light and then generate red light, and a second light conversion pattern CCF-G disposed in the second pixel region PXA-G may absorb the source light and then generate red light. A third light conversion pattern CCF-B disposed in the third pixel region PXA-B may transmit the source light.

The first light conversion pattern CCF-R and the second light conversion pattern CCF-G may be formed of quantum dots mixed (or dispersed) in the base resin.

A first insulating layer CL1 may cover the light conversion patterns CCF-R, CCF-G and CCF-B. The first insulating layer CL1 may include an inorganic material. A second insulating layer CL2 may be disposed on the first insulating layer CL1 and provide a flat surface on which the partition walls BW are disposed. The second insulating layer CL2 may include an organic material.

In the partition walls BW, a first opening portion BW-OPR, a second opening portion BW-OPG and a third opening portion BW-OPB are formed which correspond to the first pixel region PXA-R, the second pixel region PXA-G and the third pixel region PXA-B, respectively.

The light conversion patterns CCF-R, CCF-G and CCF-B may be formed using the inkjet printing apparatus 1000 according to an embodiment of the invention. The first light conversion pattern CCF-R may be formed through the bidirectional printing process by spraying a quantum dot-containing composition into the first opening portion BW-OPR. The second light conversion pattern CCF-G may be formed through the bidirectional printing process by spraying a quantum dot-containing composition into the second opening portion BW-OPG. The third light conversion pattern CCF-B may be formed through the bidirectional printing process by spraying a scatterer-containing composition into the third opening portion BW-OPB. Thus, a head 410 may include a quantum dot or scatterer that is different in each process.

The forming order of the light conversion patterns CCF-R, CCF-G and CCF-B is not limited to any one embodiment as long as the light conversion patterns are formed by the bidirectional printing process.

In FIG. 10, a display panel DP-2 may include a circuit element layer DP-CL, a display element layer DP-OLED and an upper insulating layer TFL. The circuit element layer DP-CL, display element layer DP-OLED and upper insulating layer TFL of the display panel DP-2 may correspond to the circuit element layer DP-CL, display element layer DP-OLED and upper insulating layer TFL of the display panel DP, respectively, described with reference to FIG. 8, and duplicate description is omitted.

The display panel DP-2 may include a partition wall BW disposed directly on the upper insulating layer TFL, and a light conversion pattern CCF-R. The light conversion pattern CCF-R may overlap an opening portion BW-OPR in the partition wall BW and be disposed directly on the upper insulating layer TFL.

The inkjet printing apparatus 1000 according to an embodiment of the invention may be used in the process for forming the light conversion pattern CCF-R on the upper insulating layer TFL. Thus, the light conversion pattern CCF-R may be formed through the bidirectional printing process described above, by spraying quantum dots included in a head 410 into the opening portion BW-OPR in the partition wall BW.

An inkjet printing apparatus according to an embodiment of the invention may perform a bidirectional printing process, thereby reducing the cost and time for the printing process and effectively reducing the number of heads included in a head assembly, compared to a unidirectional printing process.

In addition, a hit state of a composition according to an initial set value of the head assembly may be immediately inspected through an inspection device disposed on one side of a stage and a state of the head assembly may be determined, thereby providing an inkjet printing apparatus with improved process yield.

Although the embodiments of the present invention have been described, it is understood that the present invention should not be limited to these embodiments but various changes and modifications can be made by one ordinary skilled in the art within the spirit and scope of the present invention as hereinafter claimed.

What is claimed is:

1. An inkjet printing apparatus comprising:
    a stage, which reciprocates in forward and reverse directions opposite to each other, and has a target substrate disposed thereon;
    an inspection device including a film disposed outside the stage, and a measurement unit, which measures an inspection pattern provided on the film; and
    a head assembly, which moves along one direction crossing the forward direction, and including a plurality of heads, which supplies a liquid composition to the target substrate,
    wherein the head assembly moves in the one direction to overlap the film and sprays the composition onto the film to form the inspection pattern,
    wherein the inspection device further includes a roller part, which includes a first roller part and a second roller part spaced apart from each other in a direction parallel to a reciprocating direction of the stage and, which reciprocates the film along the forward and reverse directions,
    wherein the inkjet printing apparatus further includes a controller configured to control a moving speed and a moving direction of the target substrate to be the same as a moving speed and a moving direction of the film, respectively.

2. The inkjet printing apparatus of claim 1, wherein the inspection device further comprises:
    a film supply part and a film collection part spaced apart from each other and, which roll according to a movement direction of the film when the film reciprocates.

3. The inkjet printing apparatus of claim 2, wherein the inspection pattern comprises a first inspection pattern and a second inspection pattern, each having a line shape extending in the one direction, and
    after the head assembly forms the first inspection pattern on the film, the roller part reciprocates the film by a predetermined distance and the head assembly forms the second inspection pattern on the film.

4. The inkjet printing apparatus of claim 3, wherein each of the first inspection pattern and the second inspection pattern contains a plurality of points, and
    the measurement unit is configured to measure a distance in the forward direction between a center of a first point, among the points contained in the first inspection pattern, farthest away from the second inspection pattern in the forward direction, and a center of a second point, among the points contained in the second inspection pattern, farthest away from the first inspection pattern in the forward direction.

5. The inkjet printing apparatus of claim 4, wherein when the distance between the first point and the second point is about 50 micrometers (μm) or less, the head assembly moves in the one direction to overlap the target substrate and sprays the composition onto the target substrate.

6. The inkjet printing apparatus of claim 4, wherein when the distance between the first point and the second point is greater than about 50 μm, a set value of the head assembly is re-adjusted.

7. The inkjet printing apparatus of claim 1, wherein the target substrate comprises a plurality of regions, which are supplied with the composition,
    the regions each extend in the forward direction and the regions are spaced apart from each other in the one direction.

8. The inkjet printing apparatus of claim 7, wherein on each of the regions, a first spray of the composition is performed when the stage moves in the forward direction, and a second spray of the composition is performed when the stage moves in the reverse direction.

9. The inkjet printing apparatus of claim 1, wherein the film comprises a polymer.

10. The inkjet printing apparatus of claim 1, wherein the film comprises a water-repellent coating layer.

11. The inkjet printing apparatus of claim 1, wherein the measurement unit is disposed on one side of the inspection device or coupled to one side of the head assembly such that the measurement unit is aligned with the film.

12. The inkjet printing apparatus of claim 1, further comprising a transport device, which moves the stage in the forward direction or the reverse direction.

13. The inkjet printing apparatus of claim 1, further comprising a rail frame extending in the one direction and which guides the head assembly in the one direction, and vertical frames, which support a first end and a second end of the rail frame opposite to each other.

14. The inkjet printing apparatus of claim 1, wherein the composition comprises at least one of an organic material and a quantum dot.

* * * * *